United States Patent
Murooka

(10) Patent No.: US 7,379,324 B2
(45) Date of Patent: May 27, 2008

(54) STORAGE DEVICE

(75) Inventor: Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 11/147,323

(22) Filed: Jun. 8, 2005

(65) Prior Publication Data

US 2005/0275617 A1 Dec. 15, 2005

(30) Foreign Application Priority Data

Jun. 9, 2004 (JP) .............................. 2004-171260

(51) Int. Cl.
*G11C 11/00* (2006.01)
(52) U.S. Cl. ............. 365/151; 365/189.23; 365/189.01
(58) Field of Classification Search ................ 365/151, 365/189.23, 189.01, 158, 34, 207; 345/107
See application file for complete search history.

(56) References Cited

U.S. PATENT DOCUMENTS 6,727,883 B2 * 4/2004 Uno et al. .................. 345/107
6,956,557 B2 * 10/2005 Machida et al. ............ 345/107
2002/0163830 A1 * 11/2002 Bulovic et al.
2005/0058009 A1 * 3/2005 Yang et al.
2005/0162958 A1 * 7/2005 Chae et al. ................. 365/222
2005/0275617 A1 12/2005 Murooka

FOREIGN PATENT DOCUMENTS

JP 2002-536782 10/2002

OTHER PUBLICATIONS

U.S. Appl. No. 11/501,897, filed Aug. 10, 2006, Murooka et al.
Shin'ichiro Kimura, "Semiconductor memory; DRAM", Oyo Butsuri, vol. 69, No. 10, 2000, pp. 1233-1240.
Natsuo Ajika, "Flash memory, recent topics", Oyo Butsuri, vol. 69, No. 12, 2000, pp. 1462-1466.

* cited by examiner

*Primary Examiner*—Van Thu Nguyen
*Assistant Examiner*—Dang Nguyen
(74) *Attorney, Agent, or Firm*—Oblon, Spivak, McClelland, Maier & Neustadt, P.C.

(57) ABSTRACT

The present invention provides a storage device including a first electrode, a plurality of second electrodes arranged opposite the first electrode across a gap, and a particle which is selectively placed in one of the gaps between the first electrode and the second electrodes and which is movable between the first electrode and the second electrode and between the adjacent second electrodes. A stored state is determined utilizing the presence of the particle.

9 Claims, 11 Drawing Sheets

US 7,379,324 B2

STORAGE DEVICE

CROSS-REFERENCE TO RELATED APPLICATIONS

This application is based upon and claims the benefit of priority from prior Japanese Patent Application No. 2004-171260, filed Jun. 9, 2004, the entire contents of which are incorporated herein by reference.

BACKGROUND OF THE INVENTION

1. Field of the Invention

The present invention relates to a storage device utilizing movement of particles between electrodes.

2. Description of the Related Art

With the recent increase in the degree of integration of semiconductor devices, continuous effort has been made to reduce the sizes of circuit patterns of the LSIs constituting semiconductor devices. For a reduction in the size of the pattern, it is necessary not only to reduce line width but also to improve the dimensional and positional accuracies of the pattern. This also applies to memories, for which there has been a continuous requirement that a specified number of charges required for storage be retained in a smaller area in a cell formed using an accurate patterning technique.

Various semiconductor memories such as DRAMs, SRAMs, and flash memories have hitherto been manufactured. However, these memories employ MOSFETs as memory cells, so that the reduction in the size of the pattern is accompanied by a demand for an increase in dimensional accuracy by a percentage larger than that by which the size of the pattern is reduced. Thus, a heavy burden has also been imposed on a lithography technique for forming these patterns. This in turn has increased the cost of a lithography process accounting for the major part of the present mass production cost, that is, the product cost (OYO BUTURI, Vol. 69, No. 10, pp. 1233 to 1240, 2000, "Semiconductor memory; DRAM", OYO BUTURI, Vol. 69, No. 12, pp. 1462 to 1466, 2000, "Flash Memory, recent Topics").

On the other hand, techniques for fundamentally solving these problems with fine patterning include an attempt to artificially synthesize desired molecular structures and utilize the uniformity of synthesized molecules to obtain elements with uniform properties. However, serious problems remain to be solved which relate to techniques for arranging the synthesized molecules at desired positions and bringing the molecules into electrical contact with arranged electrodes. Moreover, disadvantageously, the elements use a very small number of charges for storage, so that disturbance such as natural radiation sharply increases the probability of malfunction of the elements.

As described above, for conventional memories using MOSFETs as their cells, with the reduction in the size of the pattern, very high dimensional and positional accuracies have been requested for the pattern. It is technically difficult to meet this demand while satisfying the request to avoid increasing the manufacture cost. On the other hand, memories utilizing molecular structures have problems with the manipulation of molecules and contact with the electrodes. Disturbance is also likely to cause these memories to malfunction.

BRIEF SUMMARY OF THE INVENTION

In accordance with a first aspect of the invention, there is provided a storage device comprising:

a first electrode;

a plurality of second electrodes each of which is placed opposite the first electrode with a gap between the first electrode and each of the second electrodes; and a particle which is placed in one of gaps between the first electrode and the plurality of second electrodes and which is movable between the first electrode and one of the second electrodes and between adjacent ones of the second electrodes.

In accordance with a second aspect of the invention, there is provided a storage device comprising:

a first substrate including a principal surface on which a plurality of parallel row lines are provided;

a second substrate including a principal surface on which a plurality of parallel column lines are provided, the principal surface of the first substrate and the principal surface of the second substrate being arranged opposite each other with a gap being provided therebetween and the column lines opposing and intersecting the row lines; and particles which are selectively arranged at intersection parts between the row lines and the column lines, each of the particles being movable between one of the row lines and one of the column lines at one of the intersection parts and between adjacent ones of the intersection parts.

In accordance with a third aspect of the invention, there is provided a storage device comprising:

a first substrate including a principal surface on which a plurality of parallel row lines are provided;

a second substrate including a principal surface on which a plurality of parallel column lines are provided, the principal surface of the first substrate and the principal surface of the second substrate being arranged opposite each other with a gap being provided therebetween and the column lines opposing and intersecting the row lines;

particles which are selectively arranged at intersection parts between the row lines and the column lines, each of the particles being movable between one of the row lines and one of the column lines at one of the intersection parts and between adjacent ones of the intersection parts;

a row decoder which selects one row line of the row lines;

a column decoder which selects one column line of the column lines; and a data reading circuit which applies a read voltage to the row line selected by the row decoder and the column line selected by the column decoder and which detects a current flowing through one intersect part of the intersection parts between the selected row line and the selected column line to detect a particle present at the intersection part.

DETAILED DESCRIPTION OF THE INVENTION

The present invention will be described below in detail with reference to the illustrated embodiments.

First Embodiment

Figure 1:
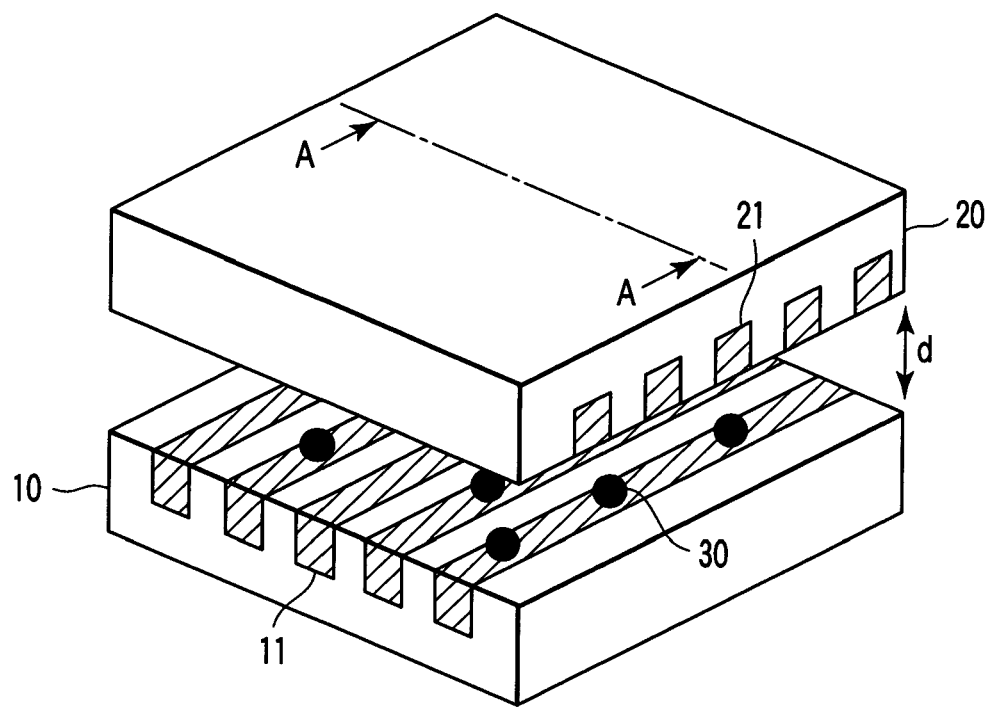
FIG. 1 is a perspective view showing the configuration of a cell section of a storage device according to a first embodiment.

FIG. 1 is a perspective view showing the configuration of a cell section of a storage device according to a first embodiment.

A plurality of parallel row lines (first electrodes) 11 are buried in a surface part of a first substrate 10. A plurality of parallel column lines (second electrodes) 21 are buried in a surface part of a second substrate 20. The substrates 10 and 20 are arranged opposite each other via a specified gap d so that their surface parts are opposite each other and that the row lines 11 and the column lines 21 cross at right angles.

Here, in conformity with typical MOS memory cells, the row lines 11 will be referred to as word lines. The column lines 21 will be referred to as bit lines.

An intersection between the word line 11 and the bit line 21 corresponds to a memory cell. At the intersections, particles 30 are selectively arranged in respective gaps between the word lines 11 and the bit lines 21; the particles 30 are movable between the adjacent electrodes. In this case, the particles 30 are movable not only in a direction perpendicular to the word lines 11 and bit lines 21 but also in a direction parallel to them. In other words, the particles 30 are movable not only in the direction in which the substrates 10 and 20 are opposite each other but also between the adjacent word lines or between the adjacent bit lines.

In such a structure, the word lines 11, provided in the first substrate 10, and the bit lines 21, provided in the second substrate 20, constitute simple lines and spaces patterns. Thus, the word lines 11 and the bit lines 21 have only to have an orthogonal positional relationship. It is thus not necessary to take into account any deviations in the direction of the word lines or bit lines. Consequently, no attention needs to be paid to the positional accuracy within a cell during manufacturing. This facilitates the manufacturing.

Figure 2:
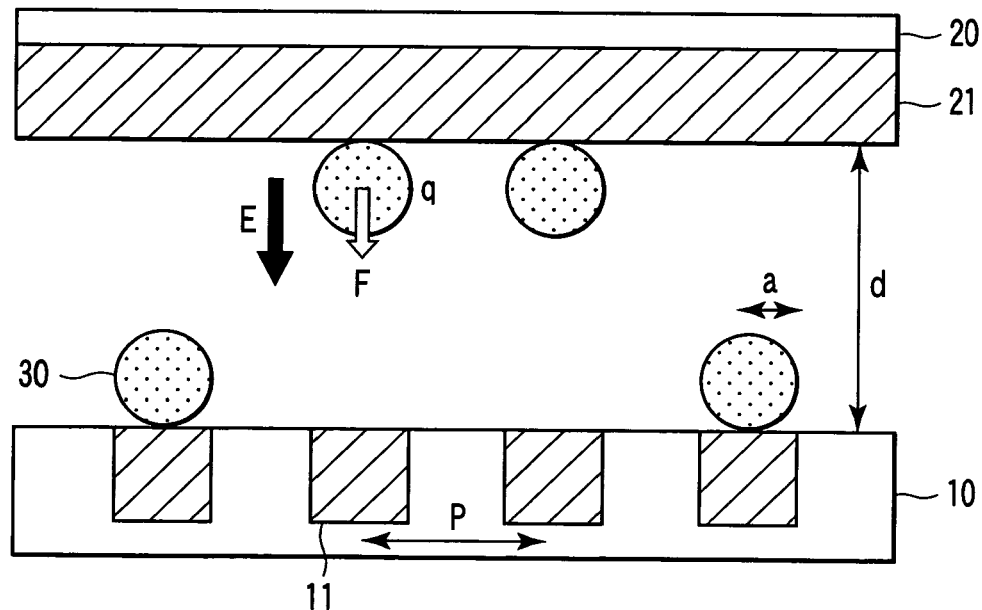
FIG. 2 is a schematic diagram illustrating the operational principle of the first embodiment.

The operational principle of the present structure will be described with reference to FIG. 2. FIG. 2 is a schematic diagram illustrating the operational principle of the present embodiment. FIG. 2 corresponds to a cross section A-A.

A particle 30 of a radius a on electrodes (word line 11 and bit line 21) has a charge q. The particle 30 is placed in an electric field E generated by a voltage applied to the electrodes. Then, the particle 30 is subjected to a force exerted by a mirror charge and a mirror dipole induced by the electrodes, in addition to a force exerted by the electric field on the charge. If the electrodes are infinitely large, an approximation of a resultant force F of the above forces is given by:

$$F = qE - \frac{q^2}{4\pi\varepsilon_0 (2a)^2} - \frac{3\pi\varepsilon_0}{8}\left(\frac{\varepsilon_r - 1}{\varepsilon_r + 2}\right)^2 (2a)^2 E^2 \quad (1)$$

where $\varepsilon_0$ denotes the dielectric constant of a vacuum (about $8.85\times10^{-12}$ F/m) and $\varepsilon_r$ denotes the relative dielectric constant of particles.

Strictly speaking, if the gaps are in the air, the dielectric constant must be corrected. The corresponding difference is very small and thus negligible. Accordingly, Equation (1) can be used as it is. The charge q is invariably an integral multiple of an elementary electric charge e (about $1.6\times10^{-19}$ C). The charge q can be expressed as q=ne. Further, when the potential difference between the opposite electrodes is defined as V and the gap between the electrodes is defined as d, the electric field can be approximated to E=V/d.

On the other hand, the capacitance C of the particle 30 is given as $C=4\pi\varepsilon_0 a$. The resultant charging energy is expressed as $(1/2)q^2/C=n^2e^2/8\pi\varepsilon_0 a$. What is called a Coulomb barrier may occur in which only electrons (or holes) having energy exceeding the charging energy are movable to the particles 30. Thus, only if the potential difference V meets $eV > n^2 e^2 / 8\pi\varepsilon_0 a$, the n-th electron (or hole) moves to the particle 30. In view of these circumstances, it is possible to express, as a graph, the force F acting on the particle 30 and defined by Equation (1). This is shown in FIG. 3.

Figure 3:
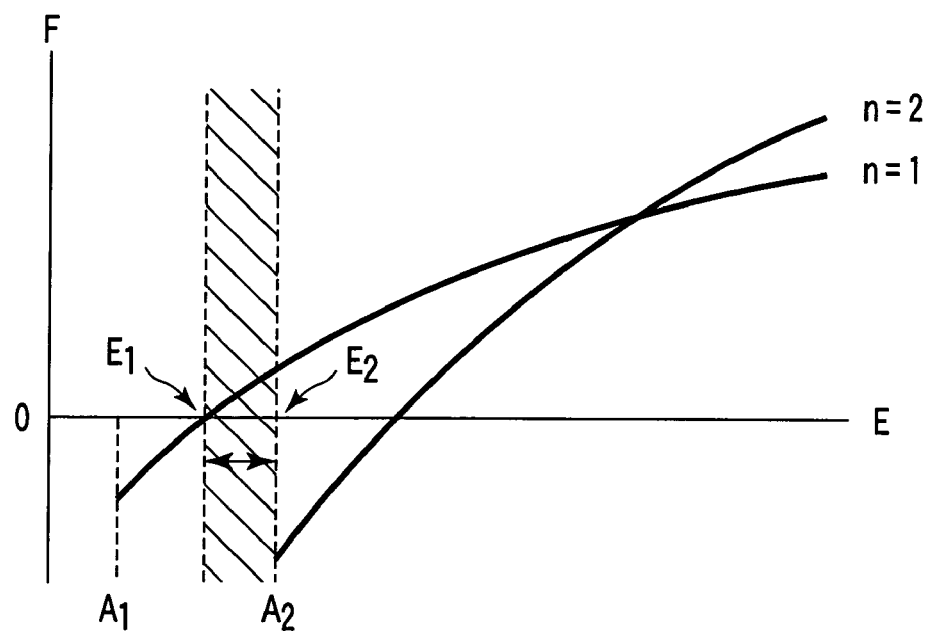
FIG. 3 is a characteristic diagram showing force acting on particles, in a graph.

FIG. 3 shows only the cases of n=1 and n=2 but is sufficient for the description of the present embodiment. The figure indicates that the presence of the Coulomb barrier causes each charged state to be realized to the right of positions shown by dotted lines A1 and A2. The figure also indicates that even with charging, an attractive force based on a mirror image overcomes the electric field until the electric field has at least a specified intensity. Consequently, the particles are not separated from the electrodes. Most importantly, in the hatched section in FIG. 3, the separation of the particles invariably occurs under the condition n=1. E1 in FIG. 3 indicates a lower-limit electric field required for the separation for n=1. E2 in FIG. 3 indicates a lower-limit electric field (Coulomb barrier) required to be charged to n=2.

The particle separated from the electrode is accelerated and reaches the opposite electrode. Then, the particle emits its charge and receives a charge of the opposite polarity. The particle is then separated from the electrode again and reaches the original electrode. This process is repeated. The series of operations cause the charge to be transported and enable it to be detected as the current between the electrodes. If the process is always executed under the condition n=1 as previously described, a specified current flows. Then, it is easy to detect whether or not any particle is present. Moreover, if two particles are present between the same electrodes, the number of carriers transporting the charges doubles, with a decrease in moving distance. Thus, at least twice as much current is detected. It is therefore possible to clearly detect that there are two particles.

Specifically, when the radius a of the particle is 10 nm and the distance d between the electrodes is 60 nm, the separation and reciprocation of the particle under the condition n=1 occur provided that an inter-electrode voltage V is between 0.22 and 0.29V. The inter-electrode voltage V is set at 0.28V, and +0.14V, which is equal to V/2, is applied to the upper electrode constituting a selected point of intersection. Further, −0.14V, which is equal to −V/2, is applied to the lower electrode constituting the point of intersection, and the other electrodes are set at 0V. In this case, immediately after separation, a force of about 0.2 pN acts on the particle present at the selected point of intersection. The time required for one-way motion is estimated at about 70 nsec. Since one charge is transported during the one-way motion of one particle, about 2 pA current is detected. Consequently, measuring this current makes it possible to detect the presence (number) of particles at the respective points of intersection between the upper and lower electrodes.

Further, electric fields are applied to nearby particles, notably particles present in adjacent parts on the same electrode. However the intensity of the electric field is in inverse proportion to the distance. Thus, when the electrodes have a horizontal pitch p of 40 nm, the electric field applied to the closest particle decreases to about 83%. The electric field applied to the second closest particle decreases to about 73%. If the inter-electrode voltage V is 0.28V as previously described, the closest particle can be separated. However, the electric field applied to the second closest particle does not reach the lower limit required for separation. Thus, only the closest particle is intended for interaction and is utilized for a writing operation as described later. When the inter-electrode voltage V is at most 0.26V, even the electric field applied to the closest particle does not reach the lower limit required for separation. Accordingly, the charge can be utilized for read-only mode without any interaction.

Thus, according to the present embodiment, a storage device can be realized by utilizing the presence of the particle 30 between the first electrode (row line) 11 and the second electrode (column line) 21. In this case, the circuit pattern of the memory section is obtained by forming only wiring for the first electrodes 11 and the second electrodes 21. This significantly simplifies the structure and eliminates the need for precise alignment and a high pattern dimension accuracy within a cell compared to the use of MOSFETs. It is thus possible to reduce the manufacturing cost. Moreover, instead of accumulated charges, the positions where the particles are present are utilized to store data. Accordingly, the present embodiment successfully resists disturbances.

Further, the minimum unit constituting the present embodiment is one linear electrode, at least two electrodes located opposite the linear electrode via a gap, and at least one particle in the gap. Thus, information can be stored utilizing the ability of the particles to move two-dimensionally between the electrodes.

The magnitude of each parameter is not limited to the above example but can be selected from a wide range. The range described below can in principle be used on the basis of the above approximation. For simplification, the ratio of the distance d between the electrodes to the radius a of each particle is defined as k (d=ka). The ratio of the horizontal pitch p of the electrodes to the distance d between the electrodes is defined as κ (p=κd). Furthermore, b and β are defined by:

$$b = \frac{2}{1 + \sqrt{1 - \frac{3\left(\frac{\varepsilon_r - 1}{\varepsilon_r - 1}\right)^2}{8}}} \quad (2)$$

$$\beta = \frac{8\pi\varepsilon_0}{e} \quad (3)$$

In this case, if the present embodiment is used in a mode with interaction, the parameters can be used within the range in which the following inequality is established.

$$\frac{k}{2}b\sqrt{1+\kappa^2} < \alpha\beta V < 4 \quad (4)$$

Further, if the present embodiment is used in the read only mode, the parameters can be used within the range in which the following inequality is satisfied.

$$\frac{k}{2}b < \alpha\beta V < \frac{k}{2}b\sqrt{1+\kappa^2} \quad (5)$$

On the other hand, in order to avoid the interaction with the second closest particle as described above, it is necessary to design the present embodiment so that Equation (6) is satisfied or to use the present embodiment under conditions under which Equation (7) is satisfied.

$$\frac{k}{2}b\sqrt{1+2\kappa^2} > 4 \quad (6)$$

$$\alpha\beta V < \frac{k}{2}b\sqrt{1+2\kappa^2} \quad (7)$$

Moreover, the application of a voltage to a selected point of intersection is not limited to the above method of applying +V/2 and −V/2, into which the inter-electrode voltage V is divided, to the upper and lower select lines. Selections can be made using the following conditions under which crosstalk does not occur. The potential of non-select lines is set at 0V. For the absolute values of voltages applied to the upper and lower select lines, the larger one is defined as $V_m$ and the ratio of $V_m$ to V is defined as γ ($V_m$=γV, 0.5≦γ≦1). In this case, it is necessary to design the present embodiment so that Equation (8) is satisfied or to use the present embodiment under conditions under which Equation (9) is satisfied.

$$\frac{k}{2}b > \gamma \alpha \beta V \quad (8)$$

$$\gamma\sqrt{1+\kappa^2} < 1 \quad (9)$$

For reference, the parameters in the above example will be shown below. k=6, κ=2/3, b=1.025, β=1.39×10$^9$ [1/V·m], and γ=0.5.

Figure 4:
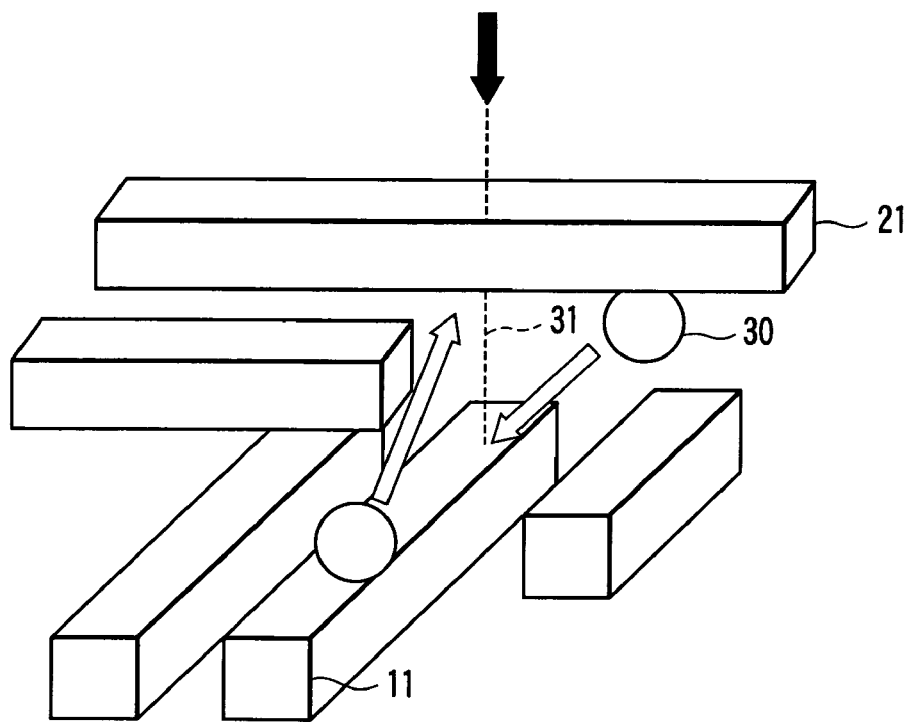
FIG. 4 is a perspective view schematically showing how particles move.

For the interaction between the points of intersection, the four closest positions have only to be considered. An actually occurring phenomenon is movement of the particle from the closest position to the selected point of intersection. However, in the previously described example of an electric field distribution, the movement is not horizontal but is always combined with vertical direction. Specifically, as shown in FIG. 4, the particles 30 on wires sharing the selected point of intersection 31 are characterized by moving in vertically opposite directions with respect to the selected point of intersection 31. Even if there is any particle close to the point of intersection 31, it does not move if it is not present on the wires sharing the point of intersection 31.

Consequently, if a particle present at a point of intersection a is to be reliably moved to another close point of intersection b, the following must be executed. A predetermined voltage is applied to a point of intersection b. The user checks whether or not a current detected at the point of intersection b has a specified value. If the current does not have the specified value, a voltage is applied to the point of intersection a to swing the particle at the point of intersection a in the vertical direction. Then, the predetermined voltage is applied to the point of intersection b again. This procedure must be repeated until the current detected at the point of intersection b has the specified value.

Figure 7:
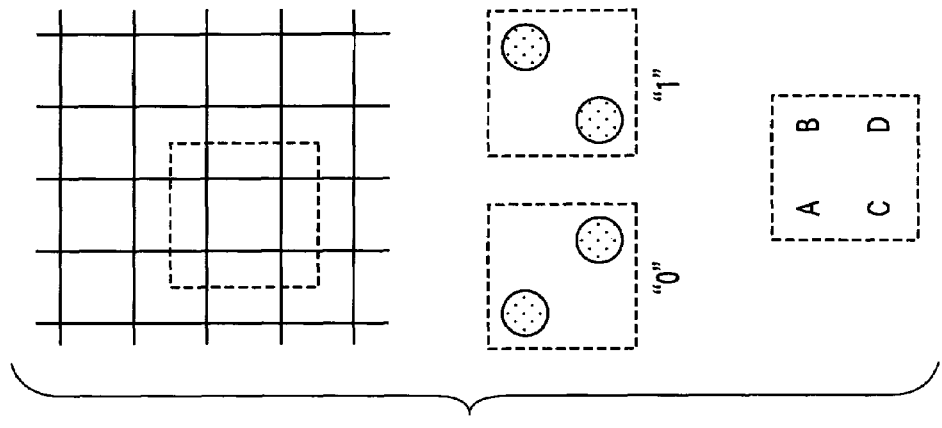
FIG. 7 is a schematic diagram illustrating the relationship between intersections and a cell and a stored state based on particles in which one-bit information is assigned to a cell composed of four points of intersection.
Figure 6:
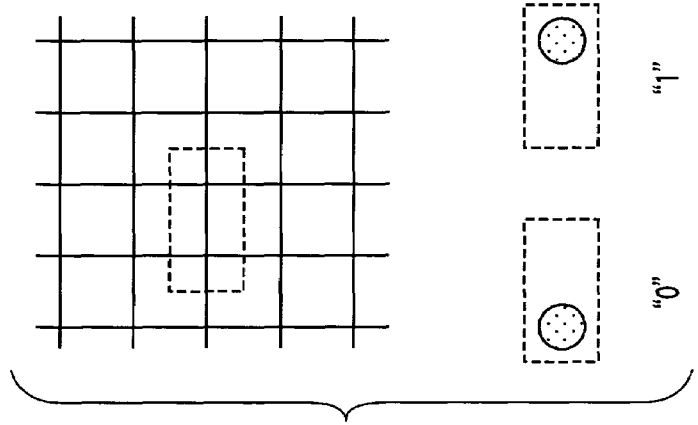
FIG. 6 is a schematic diagram illustrating the relationship between intersections and a cell and a stored state based on particles in which one-bit information is assigned to a cell composed of two adjacent points of intersection.
Figure 5:
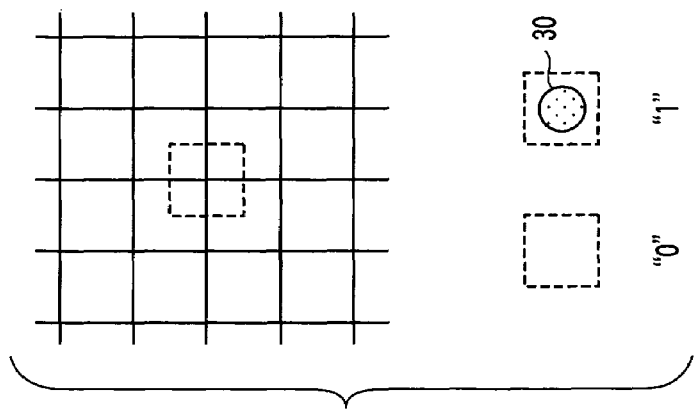
FIG. 5 is a schematic diagram illustrating the relationship between an intersection and a cell and a stored state based on particles in which one point of intersection constitutes one cell to which one-bit information is assigned.
Figure 8:
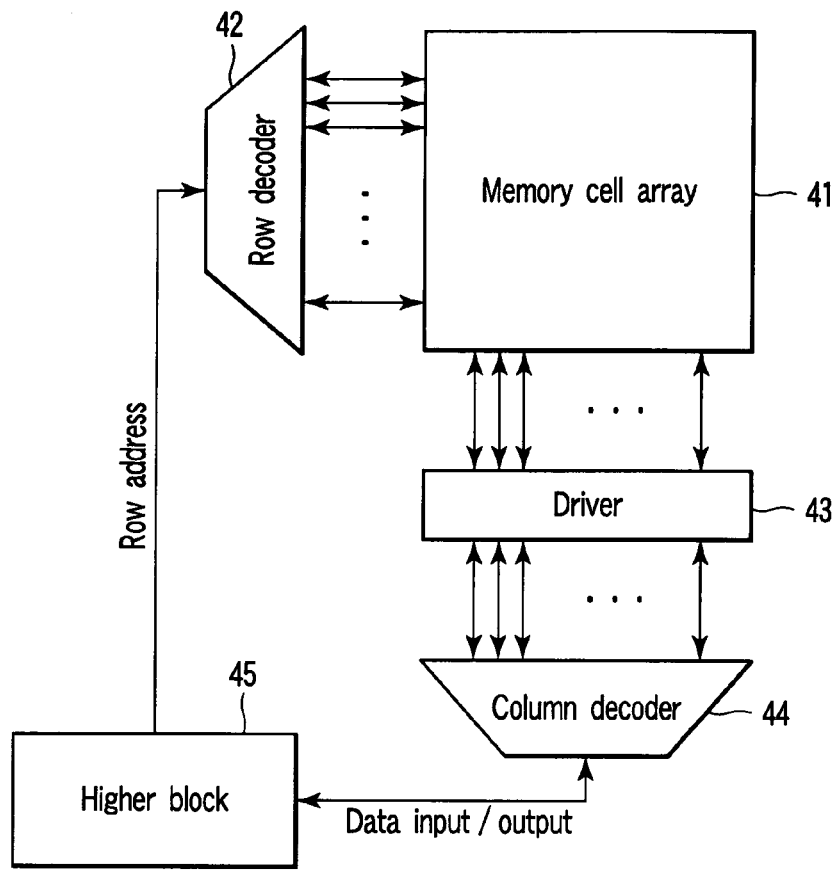
FIG. 8 is a block diagram schematically showing the configuration of a storage device including a peripheral circuit.

In view of these circumstances, three examples schematically shown in FIGS. 5 to 7 are used to write data to the present storage device. A part of a memory cell array 41 in FIG. 8 is shown in FIGS. 5 to 7. As in the case of a conventional memory, a row decoder 42 is connected to each row wire. Each column wire connects to a driver 43 including a read circuit and to a column decoder 44. Moreover, an upper level block 45 is connected to the decoders 42 and 44 in order to provide address data and to input and output data. This configuration enables information in all the columns included in the same row to be read at a time.

FIG. 5 shows a system in which one point of intersection constitutes one cell and in which one-bit information is assigned to the cell. On the basis of information indicating whether the number of particles present at a point of intersection is larger or smaller than a predetermined value, a bit of "0" or "1" is stored. The magnitude of the number of particles and the correspondence between the bits of 0 and 1 are arbitrary, and either of them may be selected. In this case, the case in which the number of particles is smaller than a predetermined value corresponds to the bit value "0". The case in which the number of particles is larger than a predetermined value corresponds to the bit value "1". The number of particles present at the point of intersection has a clear correspondence to a current flowing through the point of intersection as previously described. Consequently, bit information is read by comparing a reference value with the current flowing through the point of intersection while the read mode voltage is being applied.

For a read, an arbitrary point of intersection can be selected, that is, random access is possible. However, the technique described below is used for a write. A reservoir for particles is formed outside the final row of the memory cell array 41. Particles are obtained by applying a predetermined voltage to the points of intersection of the final row (n-th row) of the memory cells which correspond to a data column to be written to a first row of the memory cells.

Specifically, the row decoder 42 is used to select only the final row (n-th row). The column decoder 44 is then used to select only columns for which the bit value "1" is written to the first row. The contents of the first row are formed in the final row (n-th row). Then, with the selection state in the column decoder maintained, the row decoder 42 is operated to deselect the final row (n-th row), while selecting the (n−1)-th row.

As previously described, not all the particles may be moved from the n-th row to the (n−1)-th row by a single operation. Thus, a current is detected in each row and the contents of the (n−1)-th row are read. If the desired state has not been established, the n-th row is selected with the (n−1)-th row remaining selected. Once at least one clock cycle has passed, the n-th row is deselected. The contents of the data in the (n−1)-th row are checked again. The series of operations are repeated until the contents of the (n−1)-th row are in the desired state. By keeping the (n−1)-th row selected when selecting the n-th row, it is possible to swing the particles remaining on the n-th row in the vertical direction, while preventing the particles on the (n−1)-th row from returning to the n-th row.

Subsequently, with the column decoder 44 remaining selected, the row decoder 42 is operated to move the contents of the (n−1)-th row to the (n−2)-th row.

The contents of the first row can be set in the desired state by sequentially repeating these operations. Similarly, data columns to be written to the second row are transferred to the third row by sequentially moving the data columns to the appropriate row starting with the n-th one. Then, before the columns are finally moved to the second row, the second row is selected with the first row remaining selected. This enable the particles on the third row to be moved to the second row while preventing the particles present on the first row from returning to the second row.

Subsequently, data are similarly written to the third row. However, the first and second rows may remain selected before all the data are moved from the final fourth row to the third row. If the first and second rows are deselected during the movement from the n-th row to the fourth row, both rows must be selected and deselected again at the same time in order to protect the written data. All the data in the memory cell can be set in the desired state by similarly executing a write to the fourth, firth, and n-th rows in this order.

For deletion, the column decoder 44 is used to select all the columns. Then, in this state, a procedure similar to the write is used to move all the particles on the n-th row to the reservoir. Subsequently, the particles on the (n−1)-th row are moved to the reservoir via the n-th row. This procedure is executed on the particles on all the relevant rows ending with the first row. Then, all the particles are removed from the memory cell array to complete a deleting operation. The present system involves complicated writing and reading operations but advantageously increases the degree of integration.

FIG. 6 shows a system that one-bit information is assigned to a cell composed of two adjacent points of intersection. The bit of "0" or "1" is stored depending on which of two points of intersection has more particles. It is arbitrary whether the adjacent points of intersection are arranged in a vertical or lateral direction and whether the bit value "1" is stored if more particles are present at the upper, lower, the right-hand, or left-hand point of intersection. In the illustrated example, a lateral pair of points of intersection arranged in the direction of the rows is used. The bit value "1" is stored if more particles are present at the right-hand point of intersection than at the left-hand point of intersection. The bit value "0" is stored if less particles are present at the right-hand point of intersection than at the left-hand point of intersection.

According to this system, bit information is read by using the row decoder 42 and the column decoder 44 to select the points of intersection and setting the bit value "1" or "0" depending on whether a positive or negative difference is obtained when the value of a current flowing through the left-hand point of intersection is subtracted from the value of a current flowing through the right-hand point of intersection.

Specifically, a reference resistance is used to convert the current flowing through the right-hand point of intersection into a voltage. The voltage is then input to a plus input terminal of a differential amplifier. Furthermore, the reference resistance is used to convert the current flowing through the left-hand point of intersection into a voltage. The voltage is then input to a minus input terminal of the differential amplifier. Then, the polarity of an output from the differential amplifier is detected. The bit value "1" or "0" is stored depending on whether the polarity is positive or negative. With this reading method, the bit value is determined using the difference between currents flowing through the common row address line. Thus, even if there is a variation in the resistance of the row address line or the like, it can be accurately detected. Accordingly, margins can be increased. For the column address lines, closely adjacent wires are also used to detect a difference. Consequently, the present embodiment has an equivalent effect on a global variation in resistance.

With a conventional storage device in which a driving MOSFET is provided for each cell, the threshold of the MOSFET must be controlled. Accordingly, a variation in line width must be reduced to at most 10%, desirably at most 5%. In contrast, the present embodiment does not require such a strict line width control. Cells can thus be constructed easily.

When "1" is to be written, the row decoder 42 and the column decoder 44 are used to select the right-hand point of intersection of the cell. A predetermined voltage is then applied to the point of intersection for a predetermined time. Since the particles may not be moved by a single operation, a reading operation is performed in this state. That is, the column decoder 44 is used to select the right- and left-hand points of intersection, and currents flowing through these points of intersection are compared with each other. If the desired state has not been established, the row decoder 42 and the column decoder 44 are used to select the right-hand point of intersection again. The predetermined voltage is then applied to the point of intersection for the predetermined time. Then, the contents of the data in the cell are checked again. The series of operations are repeated until the desired state is established.

An alternative process may be executed as follows. The row decoder 42 and the column decoder 44 are used to select the right-hand point of intersection, and the predetermined voltage is then applied to this point of intersection for the predetermined time. Then, the left-hand point of intersection is additionally selected. Currents flowing through both points of intersection are then detected. The contents of the cell are subsequently read. If the result of the read does not conform to the desired state, the left-hand point of intersection is deselected with the right-hand point of intersection remaining selected. After at least one clock cycle has passed, the left-hand point of intersection is selected. Then the contents of the data in the cell are checked. The series of operations are repeated until the desired state is established.

This method makes it possible to reduce the number of switching operations performed by the decoders 42 and 44 for selection and de-selection. When "0" is to be written, the right-hand point of intersection, which is the target of the write of "1", is changed to the left-hand point of intersection. First, the row decoder 42 and the column decoder 44 are used to select the left-hand point of intersection of the cell. The predetermined voltage is applied to the cell for the predetermined time. Since the particles may not be moved by a single operation as previously described, a reading operation is performed in this state. That is, the column decoder 44 is used to select the right- and left-hand points of intersection, and currents flowing through these points of intersection are compared with each other. If the desired state has not been established, the row decoder 42 and the column decoder 44 are used to select the left-hand point of intersection again. The predetermined voltage is then applied to the intersection for the predetermined time. Then, the contents of the data in the cell are checked again. The series of operations are repeated until the desired state is established.

If a reduction is to be made in the number of switching operations performed by the decoders 42 and 44, the row decoder 42 and the column decoder 44 are used to select the left-hand point of intersection of the cell, and the predetermined voltage is then applied to the point of intersection for the predetermined time. Then, the right-hand point of intersection is additionally selected. Currents flowing through both points of intersection are then detected. The contents of the cell are subsequently read. If the result of the read does not conform to the desired state, the right-hand point of intersection is deselected with the left-hand point of intersection remaining selected. After at least one clock cycle has passed, the right-hand point of intersection is selected. Then the contents of the data in the cell are checked. The series of operations are repeated until the desired state is established.

In contrast to the preceding example, the present system is characterized by enabling random accesses for writes. In the illustrated example, one particle in one cell is used for the right- or left-hand point of intersection. However, a write can be carried out by holding two or more particles in one cell and handling at least one of these particles. In accordance with the principle of reads, the bit value is reversed when a change occurs in the relationship between the right-hand point of intersection and the left-hand point of intersection in terms of the number of particles. For example, if there are three particles in the cell, one particle can be handled to form a state in which the ratio of the number of particles at the left-hand point of intersection to the number of particles at the right-hand point of intersection is 2:1 and a state in which the ratio of these numbers is 1:2. These states correspond to the bit values "0" and "1", respectively.

FIG. 7 shows a system that assigns 1-bit information to a cell composed of four points of intersection. The four points of intersection are divided into a set of two points of intersection (B, C) constituting a rightward-rising diagonal line and a set of two points of intersection (A, D) constituting a rightward-falling diagonal line. The bit of "0" or "1" is stored depending on the set in which more particles are present. It is arbitrary whether the bit value "1" is stored if more particles are present in the set (B, C) or (A, D). In the illustrated example, the bit value "1" is stored if more particles are present in the rightward-rising diagonal set than in the rightward-falling diagonal set. The bit value "0" is stored if less particles are present in the rightward-rising diagonal set than in the rightward-falling diagonal set.

Bit information is read by using the row decoder 42 and the column decoder 44 to select the four points of intersection and setting the bit value "1" or "0" depending on whether a positive or negative difference is obtained when the value of a current flowing through the rightward-falling diagonal set is subtracted from the value of a current flowing through the rightward-rising diagonal set.

Specifically, a reference resistance is used to convert the current flowing through the point of intersection B into a voltage. The voltage is then input to the positive input terminal of the differential amplifier. Furthermore, the reference resistance is used to convert the current flowing through the point of intersection A into a voltage. The voltage is then input to the negative input terminal of the differential amplifier. Then, an output from the differential amplifier is detected to obtain a value equal to the number of particles present at the point of intersection A minus the number of particles present at the point of intersection B. The value (point of intersection B–point of intersection A) is temporarily stored in the driver. Then, the reference resistance is used to convert the current flowing through the point of intersection D into a voltage. The voltage is then input to the positive input terminal of the differential amplifier. Furthermore, the reference resistance is used to convert the current flowing through the point of intersection C into a voltage. The voltage is then input to the negative input terminal of the differential amplifier. Then, an output from the differential amplifier is detected to obtain a value equal to the number of particles present at the point of intersection C minus the number of particles present at the point of intersection D.

Subsequently, the value (point of intersection D–point of intersection C) is subtracted from the value (point of intersection B–point of intersection A) to obtain a value (point of intersection B+point of intersection C–point of intersection A–point of intersection D). The bit value "1" or "0" is stored depending on whether the polarity is positive or negative.

With this reading method, the bit value is determined using the difference between currents flowing through the common row and column address lines. Thus, even if there is a variation in the resistances of the row and column address lines or the like, it can be accurately detected. Accordingly, margins can be increased. With a conventional storage device in which a driving MOSFET is provided for each cell, the threshold of the MOSFET must be controlled. Accordingly, a variation in line width must be reduced to at most 10%, desirably at most 5%. In contrast, the present embodiment does not require such a strict line width control. Cells can thus be constructed easily.

When "1" is to be written, the row decoder 42 and the column decoder 44 are used to sequentially select the points of intersection B and C of the cell. The predetermined voltage is then applied to the points of intersection B and C. In contrast to the preceding example, a write operation is completed by applying the voltage to the point of intersection B once and applying the voltage to the point of intersection C once. This is because the particles on a row address line move in a direction along this line and because the particles on a column address line move in a direction along this line. For example, by attracting particles from two directions, that is, from the points of intersection B and C, the particles present at the point of intersection A is movable regardless of whether they lie on a row address line or a column address line.

To improve the reliability of storage, it is possible to perform a reading operation immediately after a write to confirm that the written information has been correctly stored. Likewise, when "0" is to be written, the row decoder 42 and the column decoder 44 are used to sequentially select the points of intersection A and D of the cell. A write operation is completed by applying the voltage to the point of intersection A once and applying the voltage to the point of intersection D once.

Thus, the present system has the advantage of being able to perform a writing operation easily and quickly. Further, the present system is also characterized by enabling random accesses for both reads and writes. In the illustrated example, the two particles in one cell are used to form the different diagonal sets. However, a write can be carried out by holding one, three, or more particles in one cell and handling at least one of these particles. As in the case of the above example, this is because, in accordance with the principle of reads, the bit value is reversed when a change occurs in the relationship between the sets of points of intersection on the different diagonal lines in terms of the number of particles.

As described above, in the present embodiment, charges are used to read and write information. However, instead of accumulated charges, the positions at which particles are present are used for storage. The present embodiment is thus characterized in that stored contents are unlikely to be affected by natural radiation. Moreover, the particle size is on the order of 10 nm as in the case of the above example. Consequently, the gravitational force acting on the particles is only about $10^{-18}$ N. It is thus possible to neglect the gravitational force acting on particles and the motion of particles attributed to an external impact. Moreover, since the present storage device does not utilize magnetism, it is not affected by any magnetic fields. The present storage device is thus very unlikely to be affected by disturbances.

Second Embodiment

Figure 9:
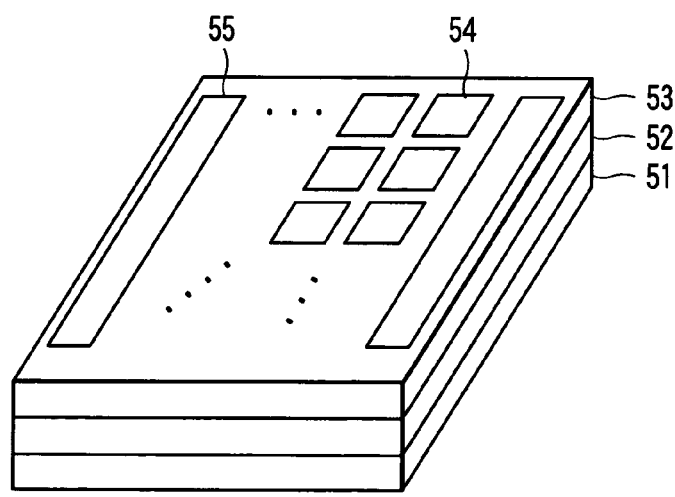
FIG. 9 is a sectional view of the general configuration of a storage device according to a second embodiment.

FIG. 9 is a sectional view of the general configuration of a storage device according to a second embodiment of the present invention.

A CMOS circuit 52 including a wiring layer is constructed on a typical Si substrate 51 using an ordinary process. A layer 53 including a plurality of memory cell sections is formed on the CMOS circuit 52. Each memory cell section 54 in FIG. 9 corresponds to the memory cell array 41 in FIG. 8. Further, the CMOS circuit 52 in FIG. 9 includes a part including the driver, decoder, and upper level block in FIG. 8 and called a peripheral circuit in a typical memory.

The CMOS circuit 52 has been designed and produced in accordance with a 90-nm design rule except for connections with the memory cell sections 54; the 90-nm design rule is less strict than a design rule for the wiring in the memory cell section 54. One memory cell section 54 occupies an about 11×11-μm area and includes 256×256 points of intersection. Each memory cell section 54 has an electric connection with the CMOS circuit 52 around its periphery. Blocks, each including the memory cell-section 54 and its peripheral connection, are arranged in a matrix. Through-holes are formed in the layer 53 including the memory cell sections 54. Moreover, I/O sections 55 of the device are formed at ends of the layer 53 including the memory cell sections 54 as shown in FIG. 9; the I/O section 55 is composed of terminals electrically coupled to an I/O section of the CMOS circuit 52.

In this configuration, an insulating film formed in each memory cell section 54 can also be used as a part corresponding to a protective film for the CMOS circuit 52. On the other hand, the memory cell sections 54 can be coupled perpendicularly to the CMOS circuit 52. It is thus possible to reduce the operation time while sharply increasing the number of cells to or from which data can be simultaneously written or read, without increasing the area of a chip. The I/O sections 55 of the device are bonded to lead frames during a packaging step as in the case of typical semiconductor devices.

Further, as previously described, one memory cell section 54 has 256×256 points of intersection. Accordingly, if one-bit information is assigned to a cell composed of four points of intersection, it is possible to assign 128×128=16, 384 bits. However, error correction code bits may be assigned to a part of a memory in order to improve its reliability. For example, when a 1 error-correction code bit is assigned to every 8 external I/O data bits, net information of about 14,336 to 14,563 bits is assigned to the same array. This reduces the amount of information that can be housed in the same array, but makes it possible to drastically improve the reliability of the memory.

The error-correction code bits may be arranged in the same row in the memory cell section 54 or in the same memory cell section 54 or may be distributed among a plurality of the memory cell sections 54 together with data. The CMOS circuit 52 can determine which of these arrangements is to be used. For high-speed data reads and writes, the error-correction code bits are desirably stored in the same row in the memory cell section 54. In order to increase the redundancy of data, it is desirable to distribute data over as wide a range as possible. Accordingly, the error-correction code bits are advantageously distributed among a plurality of the memory cell sections 54. If the error-correction code bits are arranged in the same memory cell section 54, characteristics that are intermediate between the above two cases are obtained.

Moreover, as in the case of typical memories, manufacturing yield can be increased by providing reserved row and column wires in the memory cell section 54 in association with a redundancy circuit that remedies possible defects during manufacturing. According to the present embodiment, one memory cell section 54 has a small size of about 11×11 μm. Accordingly, by providing reserved memory cell sections 54, it is possible to replace a whole block containing 256×256 points of intersection at a time by activating a redundancy circuit to remedy defects.

By arranging either a row or column wire or both row and column wires around each memory cell section 54 separately from the remedy circuit, which neither used as a storage area, it is possible to provide an appropriate area from or in which particles are supplied or stored if the number of particles inside the memory cell section 54 is too small or large. This area is connected to the circuits such as the row decoder, the column decoder, and the driver similarly to parts used as storage areas, and thus does not appear to be different from these parts. The upper level block of the CMOS circuit 52 makes this area functionally different from the other parts. Specifically, this area is utilized by executing an initializing procedure described below.

First, a predetermined voltage is sequentially applied to the points of intersection in the memory cell section 54. Then, a current flowing through each point of intersection is measured to determine the number of particles present at each point of intersection. If the number of particles in a part used as a storage area is too large or small, the particles are sequentially moved to the adjacent points of intersection so that each point of intersection has the appropriate number of particles. In this case, if the storage area as a whole runs short of particles, it is supplied with particles from an area different from the storage area. If the storage area as a whole has too large a number of particles, the particles are housed in the area different from the storage area. Finally, the number of particles at each point of intersection in the storage area is measured again to confirm that the point of intersection has a predetermined number of particles.

Third Embodiment

FIGS. 10A to 10D, 11A to 11J, 12A, and 12B are sectional views showing a process of manufacturing a storage device according to a third embodiment. These figures illustrate the process of manufacturing the storage device described in the second embodiment.

Figure 10A:
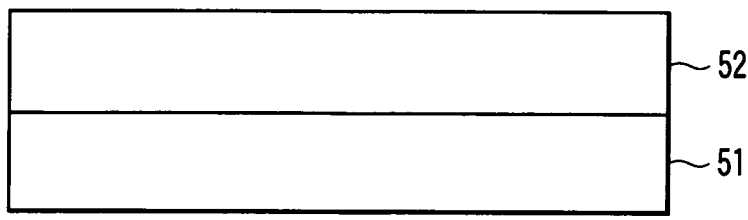
FIGS. 10A to 10D are sectional views showing a process of manufacturing a storage device according to a third embodiment.
Figure 10B:
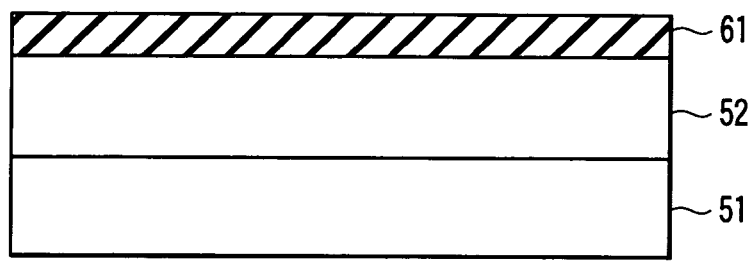

First, as shown in FIG. 10A, a desired CMOS circuit 52 is formed on one principal surface of a Si substrate (first substrate) 51 of thickness 625 μm using a normal CMOS process. The CMOS circuit 52 contains connection lines to a memory cell array in addition to an ordinary MOSFET and multi-layer wiring. Subsequently, as shown in FIG. 10B, an insulating film 61 consisting of $SiO_2$ and having a thickness of 30 nm is formed on the substrate by a CVD method using TEOS as a main material.

Figure 10C:
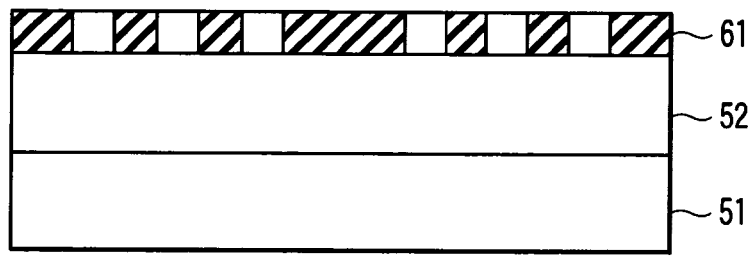
Figure 10D:
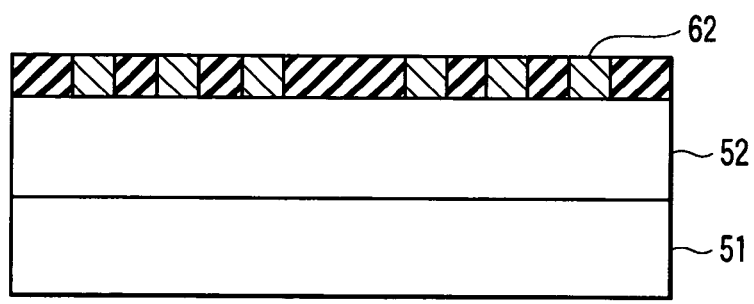

Then, as shown in FIG. 10C, a resist pattern (not shown) having a pitch of 40 nm is formed using an imprint lithography technique. The resist pattern obtained is used as a mask to pattern the $SiO_2$ film 61 by reactive ion etching using $CHF_3$ and CO gases. Subsequently, as shown in FIG. 10D, an Al film is formed by a sputtering method. What is called a reflow process is then executed to cohesively bury the Al film 62 in pattern grooves. Subsequently, extra parts of the Al film are removed by a CMP method.

Figure 11A:
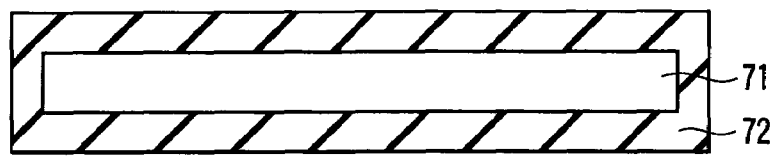
FIGS. 11A to 11J are sectional views showing the process of manufacturing a storage device according to the third embodiment.
Figure 11B:
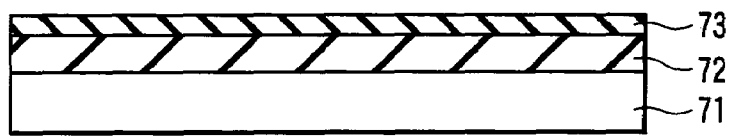
Figure 11C:
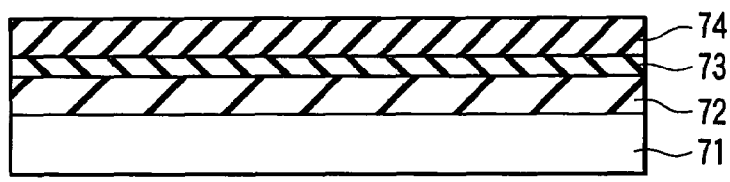

On the other hand, as shown in FIG. 11A, another Si substrate (second substrate) 71 of thickness 625 μm is provided; the Si substrate 71 has been cleaned using a dilute fluoric acid. A thermal oxide film 72 of thickness 300 nm is formed all over the surface of the substrate 71 at a temperature of 950° C. Subsequently, as shown in FIG. 11B, a $Si_3N_4$ film 73 of thickness 200 nm is formed by an LPCVD method. The $Si_3N_4$ film 73 and $SiO_2$ film 72 located on a back surface of the substrate are removed. Subsequently, an insulating film 74 consisting of $SiO_2$ and having a thickness of 30 nm is formed, by the CVD method using TEOS as a main material, on a surface of the $Si_3N_4$ film 73 which corresponds to the front surface of the substrate.

Figure 11D:
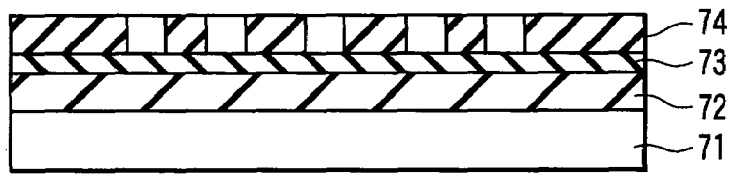
Figure 11E:
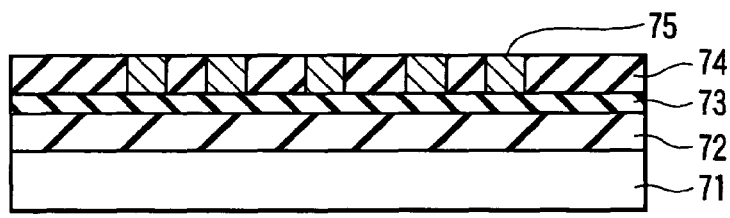

Then, as shown in FIG. 11D, a resist pattern (not shown) having a pitch of 40 nm is formed using the imprint lithography technique. The resist pattern obtained is used as a mask to pattern the $SiO_2$ film 74 by reactive ion etching using $CHF_3$ and CO gases. Subsequently, as shown in FIG. 11E, an Al film is formed by the sputtering method. A reflow process is then executed to cohesively bury an Al film 75 in pattern grooves. Subsequently, extra parts of the Al film are removed by the CMP method.

Figure 11F:
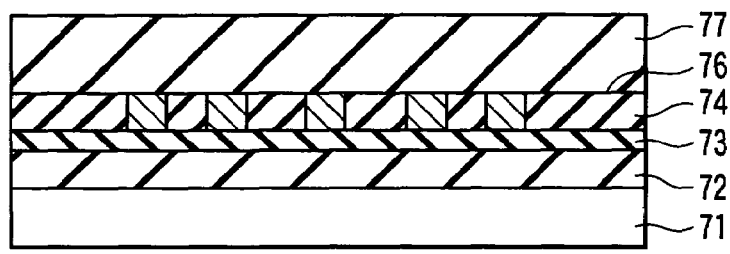

Then, as shown in FIG. 11F, a plasma nitrization process is executed to form a very thin SiN layer 76 on the $SiO_2$ surface. Then, an insulating film 77 consisting of $SiO_2$ and having a thickness of 60 nm is formed by the CVD method using TEOS as a main material.

Figure 11G:
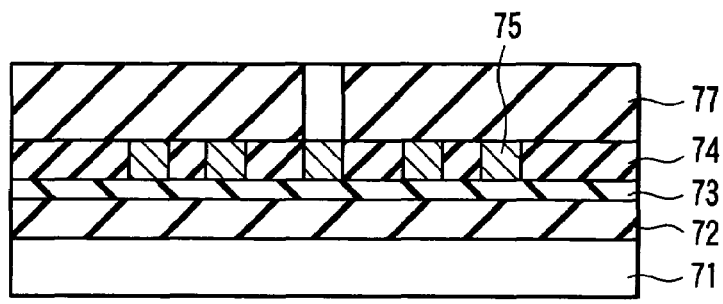
Figure 11H:
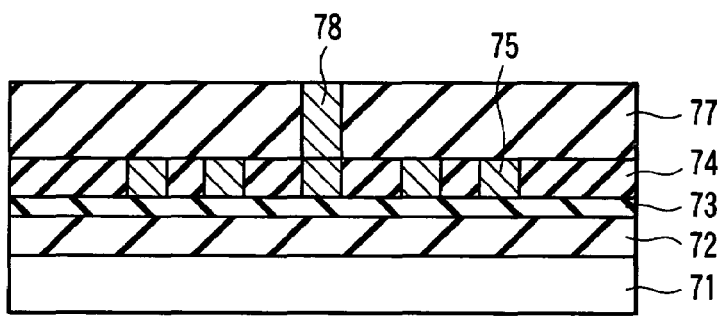

Then, as shown in FIG. 11G, a resist pattern (not shown) is formed using a photolithography process. The resist pattern obtained is used as a mask to pattern the $SiO_2$ film 77 by reactive ion etching using $CHF_3$ and CO gases. Subsequently, as shown in FIG. 11H, an Al film is formed by the sputtering method. A reflow process is then executed to cohesively bury an Al film 78 in openings obtained. Subsequently, extra parts of the Al film are removed by the CMP method.

Figure 11I:
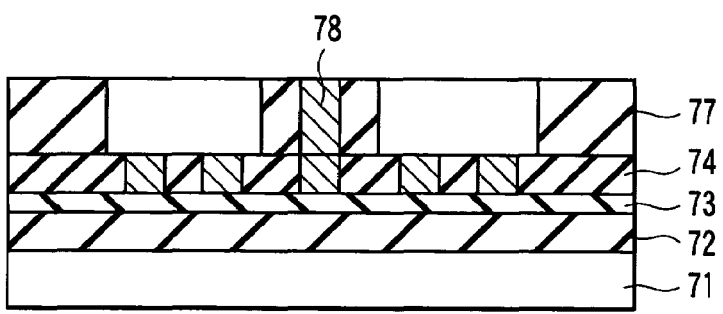
Figure 11J:
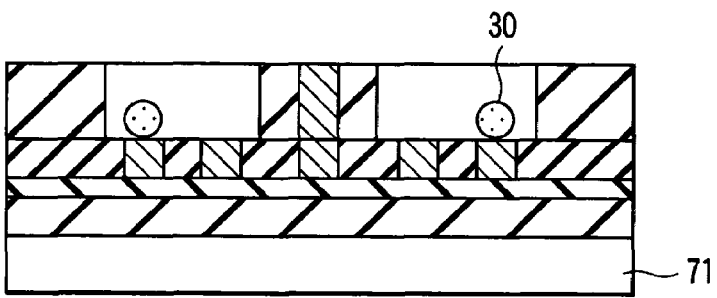

Then, as shown in FIG. 11I, a memory cell array section is patterned by the photolithography process to form a resist pattern (not shown). The resist pattern obtained is used as a mask to pattern the $SiO_2$ film 77 by reactive ion etching using $CHF_3$ and CO gases. At this time, the very thin SiN layer 76, already formed in an interface, functions as an etch stop layer. Subsequently, as shown in FIG. 11J, a sol solution is sprayed into the memory cell array section; the sol solution is obtained by dispersing, in isopropylalcohol, colloidal silica particles formed by a reversed micelle method and having a particle size of 20 nm. Then, the isopropylalcohol is vaporized to arrange a desired amount of particles 30 in the memory cell array section.

Figure 12A:
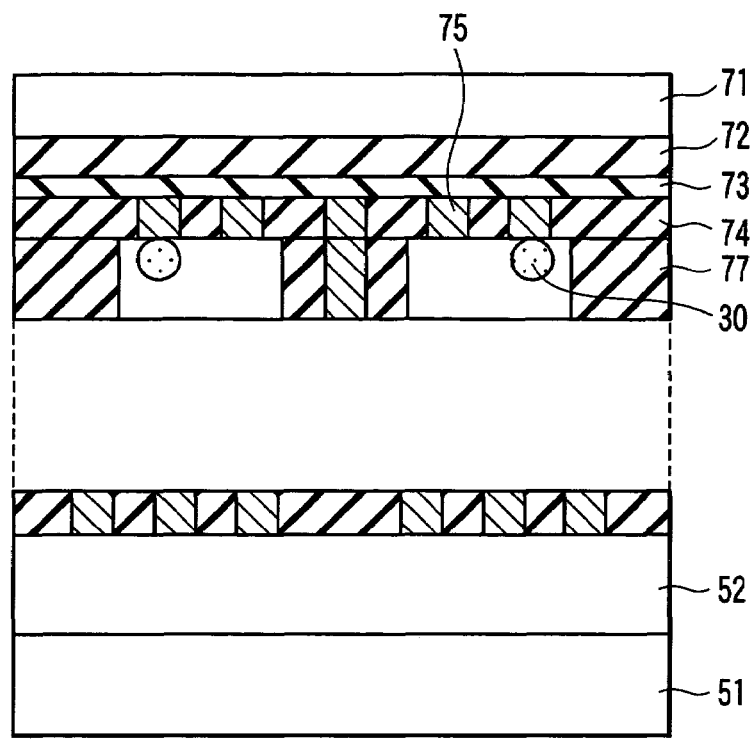
FIGS. 12A and 12B are sectional views showing the process of manufacturing a storage device according to the third embodiment.
Figure 12B:
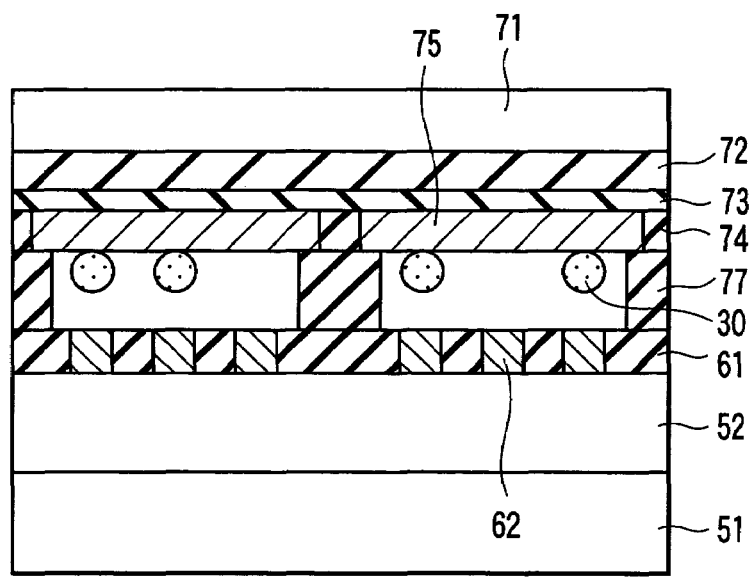
Figure 13A:
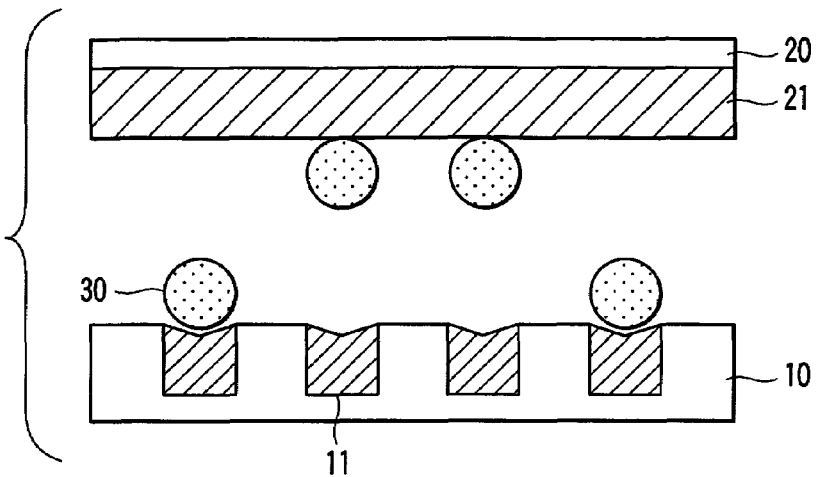
FIGS. 13A to 13C are sectional views showing the relationship between particles and a state in which wires are buried.
Figure 13B:
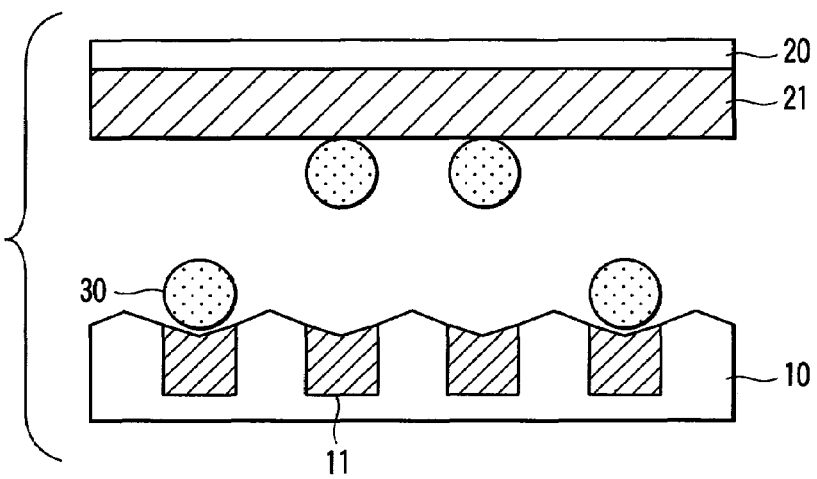
Figure 13C:
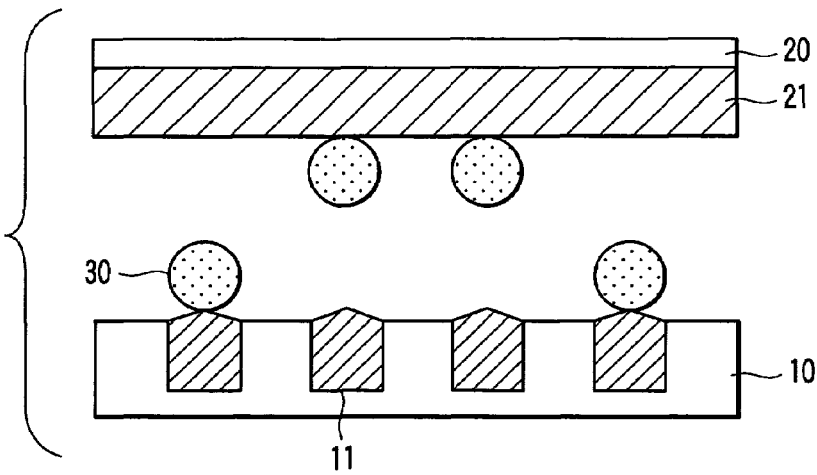

Then, as shown in FIG. 12A, the substrate obtained by the process shown in FIGS. 11A to 11J is turned upside down and then rotated so that wiring consisting of the Al film 75 extends in a predetermined direction. The substrate is then aligned with the substrate obtained by the process shown in FIGS. 10A to 10D. The two substrates adhere together by directly bonding in a dry nitrogen atmosphere at 1 atm. FIG. 12B shows that the two substrates have been bonded together. In this figure, the Al film 62 constitutes word lines and the Al film 75 constitutes bit lines. The lines 62 and 75 are arranged so as to cross at right angles.

To make the direct bond firm, a thermal treatment is executed in a nitrogen atmosphere at 200° C. for one hour after the bonding. Subsequently, the Si part of the upper substrate 71 is removed by polishing. Wire connecting portions 55 acting as I/O sections are then formed. Finally, a postprocess such as inspection or dicing is executed to complete the fabrication of a storage device.

During the above CMP process, when the process enters an over state, a central part of the wiring such as the word line 11 is recessed with respect to its ends. In this case, when the particles 30 are separated in operation, their tracks are easily aligned with one another in the vertical direction. This advantageously enables stored information to be retained more appropriately.

On the other hand, when the process enters an under state, the central part of the wiring such as the word line 11 is protruded with respect to its ends. In this case, when the particles 30 are separated in operation, their tracks are easily distributed in the lateral direction. This advantageously enables stored information to be rewritten more easily and appropriately. Therefore, the process can be fine-tuned depending on which of these characteristics is considered to be more important.

Fourth Embodiment

Figure 16:
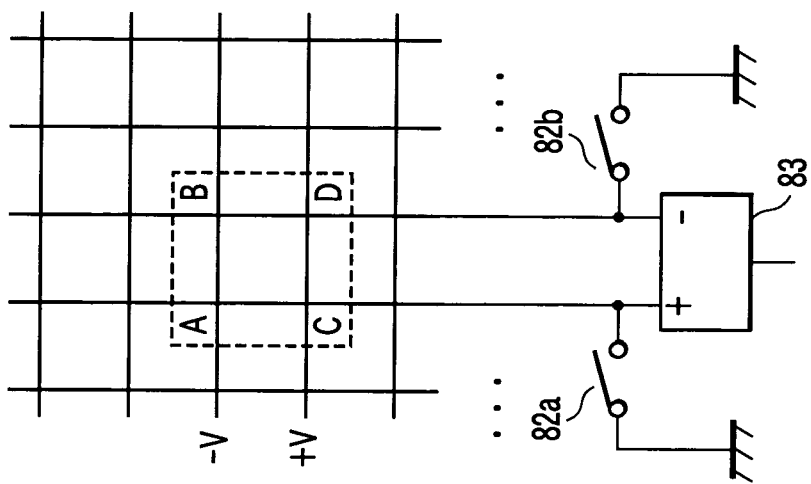
FIG. 16 is a circuit diagram showing a system in which one-bit information is assigned to a cell composed of four points of intersection, to describe the reading section of the storage device according to the fourth embodiment.
Figure 15:
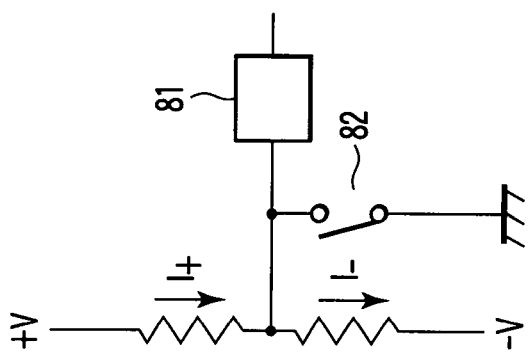
FIG. 15 is a diagram showing an equivalent circuit of FIG. 14.
Figure 14:
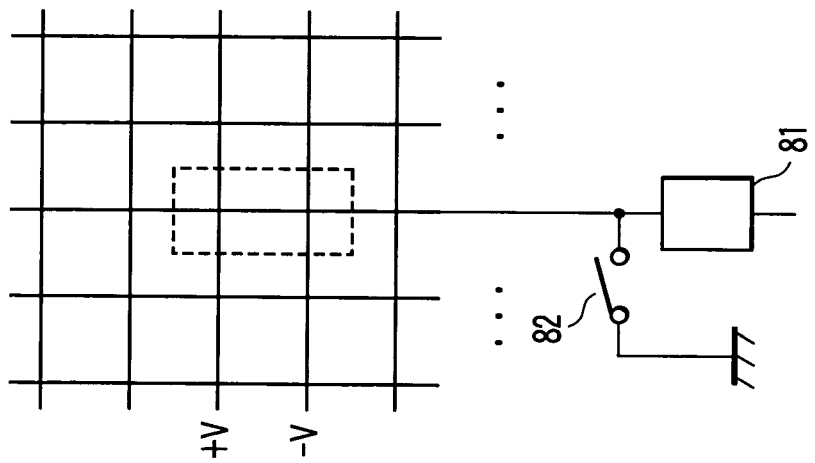
FIG. 14 is a circuit diagram showing a system in which one-bit information is assigned to a cell composed of two points of intersection, to describe a reading section of a storage device according to a fourth embodiment.

FIGS. 14 to 16 are circuit diagrams showing the configuration of a reading section of a storage device according to a fourth embodiment. Reference numeral 81 in the figures denotes an amplifier, reference numerals 82, 82a, and 82b denote switches, and reference numeral 83 denotes a differential amplifier.

According to the present embodiment, during a read, the difference between currents flowing through adjacent points of intersection is sensed as a voltage without using any reference resistance. Operations described below are performed in an example in which one-bit information is assigned to a cell composed of two points of intersection as shown in FIG. 6. As shown in FIG. 14, the column wiring, set at the ground potential (0V), is released to a floating state. Then, voltages +V and −V are applied to the adjacent row wires with the other row wires maintained at 0V.

Then, as is apparent from the equivalent circuit in FIG. 15, the potential of the column wiring approaches that of the point of intersection with the larger current. The potential of the column wiring is finally saturated when the potential difference reaches a lower limit for the separation of particles. Accordingly, if the potential of the column wiring shifts toward the positive side when amplified using the amplifier 81, it is possible to sense that the current flowing through the point of intersection to which the voltage +V is applied is larger than that flowing through the point of intersection to which the voltage −V. Conversely, if the potential of the column wiring shifts toward the negative side, it is possible to sense that the current flowing through the point of intersection to which the voltage −V is applied is larger than that flowing through the point of intersection to which the voltage +V. By arranging read circuits in parallel, it is possible to simultaneously read data from the cells in all the columns arranged on the same row.

With the same geometry as that of the preceding embodiment, the value of V is desirably about 0.25V. In this case, the potential of the column wiring varies by ±0.03V depending on the relationship between the magnitudes of the currents flowing through the points of intersection. In this case, a potential difference of 0.28V is applied to the point of intersection with the smaller current. However, this is not disadvantageous because even this voltage meets the condition that only one charge is used for electrification. Moreover, a voltage V of about 0.24V is desirably used for a read mode that completely eliminates the interaction between adjacent cells. In this case, the potential of the column wiring varies by ±0.02V depending on the relationship between the magnitudes of the currents flowing through the points of intersection. On this occasion, a potential difference of 0.26V is applied to the point of intersection with the smaller current. However, this voltage meets the condition for establishing a read only mode that completely eliminates the interaction between adjacent cells.

Further, if one-bit information is assigned to a cell composed of four points of intersection as shown in FIG. 7, it is necessary to perform two operations of reading data from the differential amplifier, followed by a comparison of the results of the reading. In contrast, the present embodiment enables the process to be accomplished using only one operation of reading data from the differential amplifier. FIG. 16 shows four points of intersection, and a voltage −V is applied to the row wire to which two of these points of intersection, that is, interconnections A and B are connected. A voltage +V is applied to the row wire to which interconnections C and D are connected. The other row wires are fixed at 0V. Then, the column wire to which the interconnections A and C are connected is connected to the positive input of the differential amplifier 83. The column wire to which the interconnections B and D are connected is connected to the negative input of the differential amplifier 83.

Then, when a current flowing through the point of intersection C is larger than that flowing through the point of intersection A, the positive input of the differential amplifier 83 becomes positive. When a current flowing through the point of intersection B is larger than that flowing through the point of intersection D, the negative input of the differential amplifier 83 becomes negative and its output becomes positive. Conversely, when the current flowing through the point of intersection-A is larger than that flowing through the point of intersection C, the positive input of the differential amplifier 83 becomes negative. When the current flowing through the point of intersection D is larger than that flowing through the point of intersection B, the negative input of the differential amplifier 83 becomes positive and its output becomes negative.

Accordingly, the sign of the (point of intersection C−point of intersection A+point of intersection B−point of intersection D) corresponds to the sign of output of the differential amplifier 83. Consequently, bit information can be read from the cell by one reading operation performed by one differential amplifier 83. This makes it possible to reduce the read time. The switches 82, 82*a*, and 82*b* shown in FIGS. 14 to 16 are not mechanical. These switches 82, 82*a*, and 82*b* utilize switching operations performed by the FETs to enable high-speed switching.

(Variation)

Figure 17:
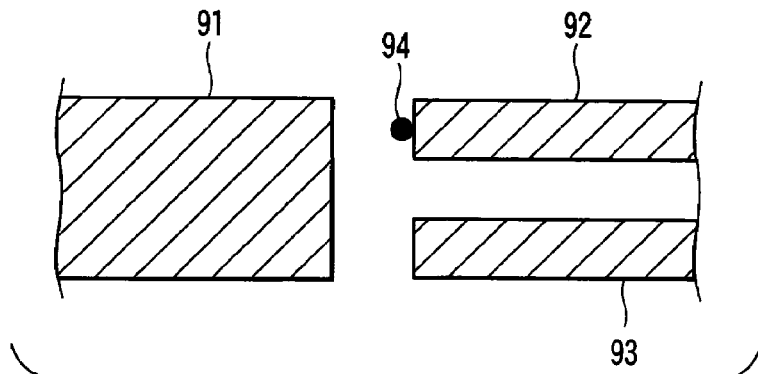
FIG. 17 is a schematic diagram showing an example of a storage device in which one first electrode is placed opposite two second electrodes, to describe a variation of the present invention.

The present invention is not limited to the above embodiments. In the description of the examples in the embodiments, there are a plurality of first electrodes and a plurality of second electrodes. However, the basic configuration of the present invention has only to include at least one first electrode 91, at least two second electrodes 92 and 93 arranged opposite the first electrode 91 via a gap, and a particle 94 selectively placed between the first electrode 91 and the second electrode 92 or 93, as shown in FIG. 17.

Figure 18:
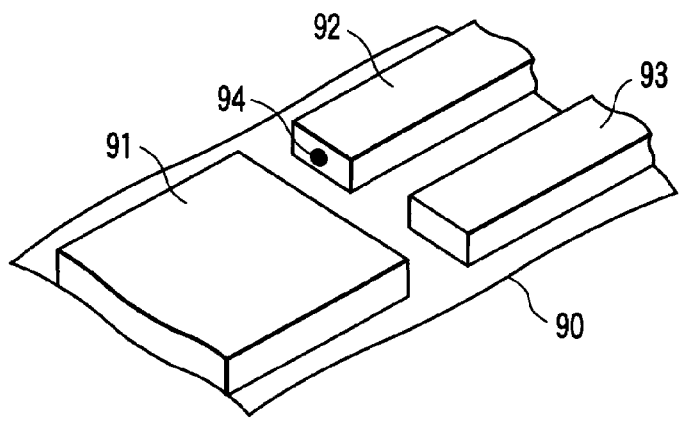
FIG. 18 is a perspective view showing an example in which the configuration in FIG. 17 is two-dimensionally implemented.
Figure 19:
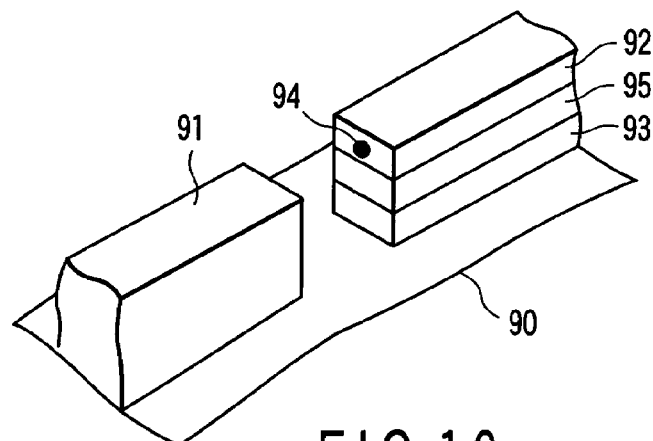
FIG. 19 is a perspective view showing an example in which the configuration in FIG. 17 is three-dimensionally implemented.

Here, a specific arrangement of the first electrode 91 and the second electrodes 92 and 93 may be as shown in FIG. 18 or 19. FIG. 18 is a perspective view showing an example in which the first electrode 91 and the second electrodes 92 and 93 are two-dimensionally arranged. The second electrodes 92 and 93 are arranged on a surface of a substrate 90 separately from each other. FIG. 19 is a perspective view showing an example in which the second electrodes 92 and 93 are three-dimensionally arranged. The second electrodes 92 and 93 are stacked via an insulating layer 95. With either configuration, whether or not the particle 94 is present can be determined by detecting a current flowing between the first electrode 91 and the second electrodes 92 and 93. This enables this structure to be used as a memory.

Further, in the embodiments, the particles used for the memory operation are colloidal silica, which is an insulator consisting of silicon oxide. However, it is possible to use other inorganic oxides, for example, aluminum oxide and titanium oxide. Moreover, organic matter such as polystyrene can be used. Further, in principle, the particles need not be an insulator. It is thus possible to use metal particles such as chromium, nickel, copper, gold, titanium, or aluminum which are conductors, or particles consisting of an alloy containing these metals. Moreover, carbon particles, silicon particles, which are semiconductors, or the like may be used. Furthermore, the shape of the particles need not be a sphere but may be a polyhedron, an ellipse, or a column.

Further, the row lines and the column lines need not intersect at right angles but have only to intersect one another. Moreover, it is possible to appropriately change the conditions such as the length of the gap between the first and second electrodes and the size of the particles in accordance with specifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A storage device comprising:
    a first substrate including a principal surface on which a plurality of parallel row lines are provided;
    a second substrate including a principal surface on which a plurality of parallel column lines are provided, the principal surface of the first substrate and the principal surface of the second substrate being arranged opposite each other with a gap being provided therebetween and the column lines opposing and intersecting the row lines;
    particles which are selectively arranged at intersection parts between the row lines and the column lines, each of the particles being movable between one of the row lines and one of the column lines at one of the intersection parts and between adjacent intersection parts;
    a row decoder which selects one row line of the row lines;
    a column decoder which selects one column line of the column lines; and
    a data reading circuit which applies a read voltage to the one row line selected by the row decoder and the one column line selected by the column decoder and which detects current flowing through one intersection part between the selected row line and the selected column line to detect a particle present at the one intersection part, wherein
    the one intersection part comprises one cell, and
    the data reading circuit is configured to select a row line and a column line extending through the one intersection part in the cell to detect a current flowing through the one intersection part, and to compare a magnitude of the current with a reference value to determine a stored state of the cell.

2. A storage device comprising:
    a first substrate including a principal surface on which a plurality of parallel row lines are provided;
    a second substrate including a principal surface on which a plurality of parallel column lines are provided, the principal surface of the first substrate and the principal surface of the second substrate being arranged opposite each other with a gap being provided therebetween and the column lines opposing and intersecting the row lines;
    particles which are selectively arranged at intersection parts between the row lines and the column lines, each of the particles being movable between one of the row lines and one of the column lines at one of the intersection parts and between adjacent intersection parts;
    a row decoder which selects one row line of the row lines;
    a column decoder which selects one column line or two column lines of the column lines; and
    a data reading circuit which applies a read voltage to the one row line selected by the row decoder and the two column lines selected by the column decoder and which detects current flowing through one intersection part between the selected row line and the selected column line to detect a particle present at the one intersection part, wherein two adjacent intersection parts comprise one cell, and the data reading circuit is configured to select one row line and two column lines extending through intersection parts in the cell, and to compare a magnitude of current flowing through one of the intersection parts in the cell with a magnitude of current flowing through another intersection part in the cell to determine a stored state of the cell.

3. A storage device comprising:

a first substrate including a principal surface on which a plurality of parallel row lines are provided;

a second substrate including a principal surface on which a plurality of parallel column lines are provided, the principal surface of the first substrate and the principal surface of the second substrate being arranged opposite each other with a gap being provided therebetween and the column lines opposing and intersecting the row lines;

particles which are selectively arranged at intersection parts between the row lines and the column lines, each of the particles being movable between one of the row lines and one of the column lines at one of the intersection parts and between adjacent intersection parts;

a row decoder which selects one row line or two row lines of the row lines;

a column decoder which selects one column line or two column lines of the column lines; and a data reading circuit which applies a read voltage to the two row lines selected by the row decoder and the two column lines selected by the column decoder and which detects current flowing through one intersection part between the selected row line and the selected column line to detect a particle present at the one intersection part, wherein one cell includes four intersection parts located adjacent to one another in a direction of the row lines and in a direction of the column lines, and the data reading circuit is configured to select two row lines and two column lines extending through intersection parts in the cell, and to compare a sum of currents flowing through two intersection parts in a diagonal direction in the cell with a sum of currents through two intersection parts in another diagonal direction in the cell to determine a stored state of the cell.

4. A storage device comprising:

a first substrate including a principal surface on which a plurality of parallel row lines are provided;

a second substrate including a principal surface on which a plurality of parallel column lines are provided, the principal surface of the first substrate and the principal surface of the second substrate being arranged opposite each other with a gap being provided therebetween and the column lines opposing and intersecting the row lines;

particles which are selectively arranged at intersection parts between the row lines and the column lines, each of the particles being movable between one of the row lines and one of the column lines at one of the intersection parts and between adjacent ones of the intersection parts;

a row decoder which selects one row line of the row lines;

a column decoder which selects one column line of the column lines;

a data reading circuit which applies a read voltage to the one row line selected by the row decoder and the one column line selected by the column decoder and which detects current flowing through one intersection part between the selected row line and the selected column line to detect a particle present at the one intersection part; and a data writing circuit which applies a write voltage to the selected row line and the selected column line to move the particle from the one intersection part between the selected row line and the selected column line to an adjacent intersection part, wherein one intersection part comprises one cell, and the data writing circuit is configured to write data by selecting a row line and a column line extending through the one intersection part of the one cell or an adjacent intersection part depending on data to be written to the cell to make a particle move between adjacent intersection parts.

5. The storage device according to claim 4, wherein the data writing circuit is configured to select, after writing the data to the cell by selecting the row line and the column line for a write, a row line and a column line extending through the one intersection part corresponding to the cell for a read, and to compare a magnitude of a current flowing through the one intersection part with a reference value, and re-select the row line and column line selected for a write for an additional write if a result of the comparison fails to satisfy a specified value.

6. A storage device comprising:

a first substrate including a principal surface on which a plurality of parallel row lines are provided;

a second substrate including a principal surface on which a plurality of parallel column lines are provided, the principal surface of the first substrate and the principal surface of the second substrate being arranged opposite each other with a gap being provided therebetween and the column lines opposing and intersecting the row lines;

particles which are selectively arranged at intersection parts between the row lines and the column lines, each of the particles being movable between one of the row lines and one of the column lines at one of the intersection parts and between adjacent ones of the intersection parts;

a row decoder which selects one row line of the row lines;

a column decoder which selects one column line of the column lines;

a data reading circuit which applies a read voltage to the one row line selected by the row decoder and the one column line selected by the column decoder and which detects current flowing through one intersection part between the selected row line and the selected column line to detect a particle present at the one intersection part; and a data writing circuit which applies a write voltage to the selected row line and the selected column line to move the particle from the one intersection part between the selected row line and the selected column line to an adjacent intersection part, wherein two adjacent intersection parts comprise one cell, and the data writing circuit is configured to write data by selecting a row line and a column line extending through one or the other of the two adjacent intersection parts corresponding to the cell depending on data to be written to the cell to make a particle move between the two adjacent intersection parts.

7. The storage device according to claim 6, wherein the data writing circuit is configured to select, after selecting the row line and the column line for a write to write the data to the cell, a row line and a column line extending through intersection parts corresponding to the cell for a read, and to compare a magnitude of a current flowing through one of the two adjacent intersection parts with a magnitude of a current flowing through another of the two adjacent intersection parts, and reselect the row line and column line selected for a write for an additional write if a relationship between the magnitudes is different from a desired state.

8. A storage device comprising:
 a first substrate including a principal surface on which a plurality of parallel row lines are provided;
 a second substrate including a principal surface on which a plurality of parallel column lines are provided, the principal surface of the first substrate and the principal surface of the second substrate being arranged opposite each other with a gap being provided therebetween and the column lines opposing and intersecting the row lines;
 particles which are selectively arranged at intersection parts between the row lines and the column lines, each of the particles being movable between one of the row lines and one of the column lines at one of the intersection parts and between adjacent ones of the intersection parts;
 a row decoder which selects one row line of the row lines;
 a column decoder which selects one column line of the column lines;
 a data reading circuit which applies a read voltage to the one row line selected by the row decoder and the one column line selected by the column decoder and which detects current flowing through one intersection part between the selected row line and the selected column line to detect a particle present at the one intersection part; and
 a data writing circuit which applies a write voltage to the selected row line and the selected column line to move the particle from the one intersection part between the selected row line and the selected column line to an adjacent intersection part, wherein
 one cell comprises four intersection parts located adjacent to one another in a direction of the row lines and in a direction of the column lines, and
 the data writing circuit is configured to write data by using the row decoder and the column decoder to sequentially select two of the four intersection parts corresponding to the cell which extend in a diagonal direction or two of the four intersection parts which extend in another diagonal direction, depending on data to be written to the cell to make a particle move between the four intersection parts.

9. The storage device according to claim 8, wherein the data writing circuit is configured to select, after selecting the row line and the column line for a write to write the data to the cell, a row line and a column line extending through intersection parts corresponding to the cell for a read, and to compare a sum of currents flowing through the two intersection parts in the diagonal direction in the cell with a sum of currents flowing through the two intersection parts in the another diagonal direction, and re-select the row line and column line selected for a write for an additional write if a relationship between magnitudes of the sums is different from a desired state.

* * * * *